(12) United States Patent
Nagawaram et al.

(10) Patent No.: US 12,298,356 B2
(45) Date of Patent: May 13, 2025

(54) SYSTEM AND METHOD FOR GROUNDED-NEUTRAL FAULT DETECTION

(71) Applicant: ABB Schweiz AG, Baden (CH)

(72) Inventors: Chandrashekar Nagawaram, Hyderabad (IN); Lucas J. McPhee, Unionville, CT (US); John P. Filipetti, Bloomfield, CT (US)

(73) Assignee: ABB Schweiz AG, Baden (CH)

( * ) Notice: Subject to any disclaimer, the term of this patent is extended or adjusted under 35 U.S.C. 154(b) by 212 days.

(21) Appl. No.: 17/548,770

(22) Filed: Dec. 13, 2021

(65) Prior Publication Data
US 2023/0184848 A1  Jun. 15, 2023

(51) Int. Cl.
*G01R 31/52* (2020.01)
*H02H 1/00* (2006.01)
*H02H 3/16* (2006.01)

(52) U.S. Cl.
CPC .......... *G01R 31/52* (2020.01); *H02H 1/003* (2013.01); *H02H 3/162* (2013.01); *H02H 3/167* (2013.01)

(58) Field of Classification Search
CPC ........ G01R 31/52; H02H 1/003; H02H 3/162; H02H 3/167
See application file for complete search history.

(56) References Cited

U.S. PATENT DOCUMENTS

| | | | | |
|---|---|---|---|---|
| 4,012,668 A | * | 3/1977 | Wittlinger | H02H 3/331 361/93.6 |
| 2002/0100060 A1 | * | 7/2002 | Sugiura | H03H 7/01 725/127 |
| 2008/0106833 A1 | * | 5/2008 | Lewinski | G01R 31/52 361/49 |
| 2008/0239596 A1 | * | 10/2008 | Restrepo | G01R 31/52 324/509 |
| 2010/0309592 A1 | * | 12/2010 | Kinsel | H02H 3/331 361/50 |
| 2011/0216453 A1 | * | 9/2011 | Haines | H02H 9/00 361/49 |
| 2017/0249001 A1 | * | 8/2017 | Roszel | H04L 63/20 |
| 2017/0285087 A1 | * | 10/2017 | Onishi | G01R 35/005 |
| 2019/0128944 A1 | * | 5/2019 | Englert | H02H 3/17 |

FOREIGN PATENT DOCUMENTS

JP 2002290289 * 10/2002 ............... H03H 7/09

* cited by examiner

*Primary Examiner* — Lisa M Caputo
*Assistant Examiner* — Sharah Zaab
(74) *Attorney, Agent, or Firm* — Leydig, Voit & Mayer, Ltd.

(57) ABSTRACT

A fault detector detects grounded-neutral faults. The fault detector is configured to: receive a first signal from a first induction circuit, the first induction circuit configured to detect a current imbalance between a line conductor and a neutral conductor; determine a first frequency and a first phase of a noise signal component of the first signal; output a noise cancellation signal to a primary side of the first induction circuit, the noise cancellation signal having the first frequency of the noise signal component and an opposite phase than the first phase of the noise signal component; and generate a trip signal based on determining that an impedance of the neutral conductor to ground is at or below a threshold level based upon the first signal received during the injection of the noise cancelation signal.

20 Claims, 5 Drawing Sheets

SYSTEM AND METHOD FOR GROUNDED-NEUTRAL FAULT DETECTION

FIELD

The present disclosure relates to systems and methods for detecting grounded-neutral fault conditions in alternating current (AC) circuits.

BACKGROUND

Utility power is primarily supplied to customers as AC electrical power via three lines including two "hot" lines and one neutral line. Premises that receive utility power then create their own network of three-lined power circuits to connect to utility power. In many instances, this leads to extensive and complex networks of AC power lines that meet the utility power lines in a single hub, where premises hot lines are connected to the utility's hot lines, and premises ground lines are merged to form a single neutral ground line. To prevent short circuits, ground loops, or other undesirable or unsafe electrical conditions, it is critically important that a premises shares a neutral connection with the utility and ground. For this reason, live electrical systems are often inspected using inductive circuitry that can determine whether neutral lines are properly grounded.

The benefits of AC power delivered in the configuration described above are well-established, and the same benefits have led to an ever-increasing proliferation of consumer electronics and appliances used in residential, commercial, and industrial applications. However, the quantity and variety of such devices drawing AC power may lead to significant load noise being observable between line (hot) and neutral lines. In many instances, the complexity, quantity, or variety of electrically connected devices causes load noises too severe for traditional inductive circuitry to properly determine whether neutral lines are properly grounded within an acceptable margin of error. Thus, at best load noise may be obtrusive and delay inspection processes, and at worst, load noise may interfere with grounded-neutral fault detection, leading to unsafe electrical conditions.

Therefore, the present inventors have recognized a need for an improved system and method for minimizing and/or neutralizing the effects of load noise in grounded-neutral fault detection.

SUMMARY

The present disclosure provides improved systems and methods of detecting grounded-neutral faults that mitigates or solves the drawback and problems of conventional grounded-neutral fault detection solutions. For example, aspects of the present disclosure provide, inter alia, an improved system and method for canceling and/or avoiding the effects of noise (e.g., load noise) in grounded-neutral fault detection and minimize nuisance trips in the field.

According to a first aspect of the present disclosure, a fault detector is provided that detects, inter alia, grounded-neutral faults. The fault detector is configured to: receive a first signal from a first induction circuit, the first induction circuit configured to detect a current imbalance between a line conductor and a neutral conductor; determine a first frequency and a first phase of a noise signal component of the first signal; output a noise cancellation signal to a primary side of the first induction circuit, the noise cancellation signal having the first frequency of the noise signal component and an opposite phase than the first phase of the noise signal component; output a grounded neutral test signal while the noise cancellation signal is being output; and generate a trip signal based on determining that an impedance of the neutral conductor to ground is at or below a threshold level based upon the first signal received during the concurrent output of the noise cancelation signal and the grounded neutral test signal.

The fault detector according to the first aspect has several advantages over the state of the art. The fault detector according to the first aspect, advantageously, is capable of dynamically determining a frequency (or frequencies) of a load noise and inject a current in opposite phase counter to the (differential) load noise. In this way, the fault detector according to the first aspect nullifies or mitigates interference that load noise may cause to a grounded-neutral test measurement. This advantageous feature enhances the signal-to-noise ratio of the circuit gain of the fault detector. Additionally, the fault detector according to the first aspect is capable of preventing or mitigating nuisance trips for grounded-natural faults by enabling greater precision of its root mean squared (RMS) voltage measurements. This, in turn, enables more accurate measurements of low ground-to-neutral impedances (e.g., enabling accurate differentiation between a 2Ω impedance—indicating a fault—and an acceptable, 6Ω impedance).

In an implementation of the first aspect, the fault detector may be configured to determine that the impedance is at or below the threshold level by performing the following: outputting, for a predetermined time interval, the noise cancellation signal to the primary side of the first induction circuit; outputting, for the predetermined time interval, the grounded neutral test signal to a secondary winding of a second induction circuit such that a complementary signal is inductively injected into the neutral conductor; receiving, for the predetermined time interval, the first signal from the first induction circuit as a noise compensated signal; accumulating, for the predetermined time interval, an AC root mean square (RMS) voltage measurement of the noise compensated signal; and comparing the accumulated AC RMS voltage measurement of the noise compensated signal to a predetermined value corresponding to the threshold level.

In an implementation of the first aspect, the fault detector may be configured to determine a test frequency of the grounded neutral test signal based upon the first frequency of the noise component of the first signal, the output grounded neutral test signal having the test frequency.

In an implementation of the first aspect, the fault detector may be configured to determine the first frequency and the first phase of the noise signal component of the first signal based upon the first signal that is received while the test input is not being output.

In an implementation of the first aspect, the first signal may correspond to band-pass filtered output signal of a secondary winding of the first induction circuit, and the fault detector may be configured to: determine a plurality of frequency components of the first signal; determine a quiet window of the first signal based upon the determined frequency components; and generate the grounded neutral test signal with a frequency corresponding to the quiet window.

In an implementation of the first aspect, the fault detector may be configured to: determine a respective amplitude for each of the frequency components of the first signal; determine as a quiet component of the first signal one of the frequency components having the lowest determined amplitude, and set the quiet window based on the quiet component such that a range of frequencies within the quiet window comprises a corresponding frequency associated with the quiet component.

In an implementation of the first aspect, the threshold level may preconfigured to correspond to an impedance of 2 ohms. The fault detector may be configured not to generate the trip signal when the impedance is measured to be 6 ohms. The fault detector is designed to precisely differentiate between a 2 ohm and 6 ohm impedance in the presence of a noisy load.

In an implementation of the first aspect, the first signal may correspond to band-pass filtered output signal of a secondary winding of the first induction circuit. The fault detector may be configure to: determine a plurality of frequency components of the first signal; determine respective amplitudes for the frequency components of the first signal; select, as the noise signal component of the first signal, a respective one of the frequency components of the first signal with the highest amplitude from among the determined amplitudes of the frequency components of the first signal.

In an implementation of the first aspect, the fault detector may be to: receive a second signal from the first induction circuit; determine whether there is the current imbalance between the line conductor and the neutral conductor based upon the second signal; and generate the trip signal based on determining that there is the current imbalance.

Accordingly, the fault detector is configured to detect multiple types of ground faults, including a grounded-neutral fault a short-to-ground fault.

According to a second aspect of the present disclosure, a fault detector is provided that detects, inter alia, grounded-neutral faults. The fault detector is configured to: receive a first signal from a first induction circuit, the first induction circuit configured to detect a current imbalance between a line conductor and a neutral conductor; determine a plurality of frequency components of the first signal; determine a quiet window of the first signal based upon the determined frequency components; and generate a grounded neutral test signal for determining a grounded-neutral fault with a frequency corresponding to the quiet window.

The fault detector according to the second aspect has several advantages over the state of the art. The fault detector according to the second aspect, advantageously, is able to determine a quiet window—e.g., a frequency of range of frequencies—in the load noise signal where there will be little to no interference with the grounded-neutral fault detection signal. The grounded fault detector then operates the grounded-neutral fault detection signal within the quiet window, avoiding the ill effects of the load noise. In this way, the fault detector according to the first aspect nullifies or mitigates interference that load noise may cause to a grounded-neutral test measurement. This advantageous feature enhances the signal-to-noise ratio of the circuit gain of the fault detector. Additionally, the fault detector according to the first aspect is capable of preventing or mitigating nuisance trips for grounded-natural faults by enabling greater precision of its root mean squared (RMS) voltage measurements. This, in turn, enables more accurate measurements of low ground-to-neutral impedances (e.g., enabling accurate detection between a 2Ω impedance—indicating a fault—and an acceptable, 6Ω impedance).

In an implementation of the second aspect, the quiet window may be determined as single frequency, a 5 Hz rage of frequencies, a 15 Hz rage of frequencies, or a 50 Hz range of frequencies.

Each of the features and implementations of the first aspect may be incorporated (individually or in multiples) into the second aspect and vice versa. For example, the second aspect may be implemented to include a fault detector that is configured to determine a first frequency and a first phase of a noise signal component of the first signal; output a noise cancellation signal to a primary side of the first induction circuit, the noise cancellation signal having the first frequency of the noise signal component and an opposite phase than the first phase of the noise signal component; and generate a trip signal based on determining that an impedance of the neutral conductor to ground is at or below a threshold level based upon the first signal received during the injection of the noise cancelation signal.

In an implementation of the second aspect, the fault detector may be configured to generate a trip signal based on determining that an impedance of the neutral conductor to ground is at or below a threshold level based upon the first signal received during the injection of the grounded neutral test signal in the quiet window.

In an implementation of the second aspect, the fault detector may be configured to determine that the impedance is at or below the threshold level by performing the following: outputting, for a predetermined time interval, the grounded neutral test signal-having at least one characteristic frequency in the quiet window—to a secondary winding of a second induction circuit such that a complementary signal is inductively injected into the neutral conductor; receiving, for the predetermined time interval, the first signal from the first induction circuit as a noise avoided signal; accumulating, for the predetermined time interval, an AC root mean square (RMS) voltage measurement of the noise avoided signal; and comparing the accumulated AC RMS voltage measurement of the noise avoided signal to a predetermined value corresponding to the threshold level.

A third aspect of the present disclosure provides a ground fault interrupt circuit (GFCI) comprising a fault detector according to the first and/or second aspect of the present disclosure. The GFCI according to the third aspect, therefore, incorporates at least the advantages and implementations as discussed above with respect to the first and/or second aspects of the present disclosure.

In an implementation of the third aspect, the GFCI includes a first induction circuit, which has a core, a primary side, and a secondary side, an aperture of the core being configured to receive the line conductor and the neutral conductor to form at least part of a primary winding at the primary side, and the secondary side comprising a secondary winding, wound around the core and coupled to the fault detector to transmit the first signal; and a trip circuit configured to disconnect at least the line conductor from a supply to a load based on receiving the trip signal from the fault detector.

According to an implementation of the fault detector of the first through third second aspect, the fault detector may have a self-test circuit including a transistor, the transistor having an output coupled to a wire, the wire passing through the core of the first induction circuit forming another part of the primary winding at the primary side.

According to an implementation of the fault detector of the first through third second aspect, the fault detector may be configured to drive the transistor of the self-test circuit to output the noise cancellation signal to the wire such that at least part the noise signal is canceled and not detected at the first induction circuit.

According to an implementation of the fault detector of the first through third second aspect, the fault detector may be configured to drive the transistor of the self-test circuit to output a self-test signal to the wire such that an ground fault is simulated (e.g., a current imbalance indicating a short-to-ground fault).

According to a fourth aspect of the present disclosure, methods are provided for operating a fault detector—according to the first and/or second aspects—and/or a GFCI—according to the third aspect—to detect, inter alia, grounded-neutral faults. The methods according the fourth aspect therefore, share at least the same features and advantages of the first through third aspects of the present disclosure. The method according to the fourth aspect, advantageously, is capable of dynamically determining a frequency (or frequencies) of a load noise and inject a current in opposite phase counter to the (differential) load noise and/or avoiding the load noise by operating in a quiet window.

For example, in an implementation according to the fourth aspect, the method includes: receiving a first signal from a first induction circuit, the first induction circuit configured to detect a current imbalance between a line conductor and a neutral conductor; determining a first frequency and a first phase of a noise signal component of the first signal; outputting a noise cancellation signal to a primary side of the first induction circuit, the noise cancellation signal having the first frequency of the noise signal component and an opposite phase than the first phase of the noise signal component; outputting a grounded neutral test signal while the noise cancellation signal is being output; and generating a trip signal based on determining that an impedance of the neutral conductor to ground is at or below a threshold level based upon the first signal received during the concurrent output of the grounded neutral test signal and the noise cancelation signal.

According to an alternative and/or additional implementation according to the fourth aspect, the method includes operating the fault detector to: receive a first signal from a first induction circuit, the first induction circuit configured to detect a current imbalance between a line conductor and a neutral conductor; determine a plurality of frequency components of the first signal; determine a quiet window of the first signal based upon the determined frequency components; and generate the grounded neutral test signal for determining a grounded-neutral fault with a frequency corresponding to the quiet window.

According to a fifth aspect of the present disclosure, a computer readable medium is provided. The computer readable medium comprises instructions, which upon execution by a processor configure a fault detector of GFCI to perform a method according to the fourth aspect of the present disclosure. The computer readable medium according the fifth aspect, therefore, shares at least the same features and advantages of the first through fourth aspects of the present disclosure. The computer readable medium according to the fifth aspect, advantageously, enables dynamic determination of a frequency (or frequencies) of a load noise and injection of a current in opposite phase counter to the (differential) load noise and/or avoiding the load noise by operating in a quiet window.

Further applications and advantages of the aspects and implementations of the present disclosure are provided below.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various implementations will become apparent by reading the following detailed description with reference to the attached drawings, which illustrate the following.

DETAILED DESCRIPTION

Figure 1:
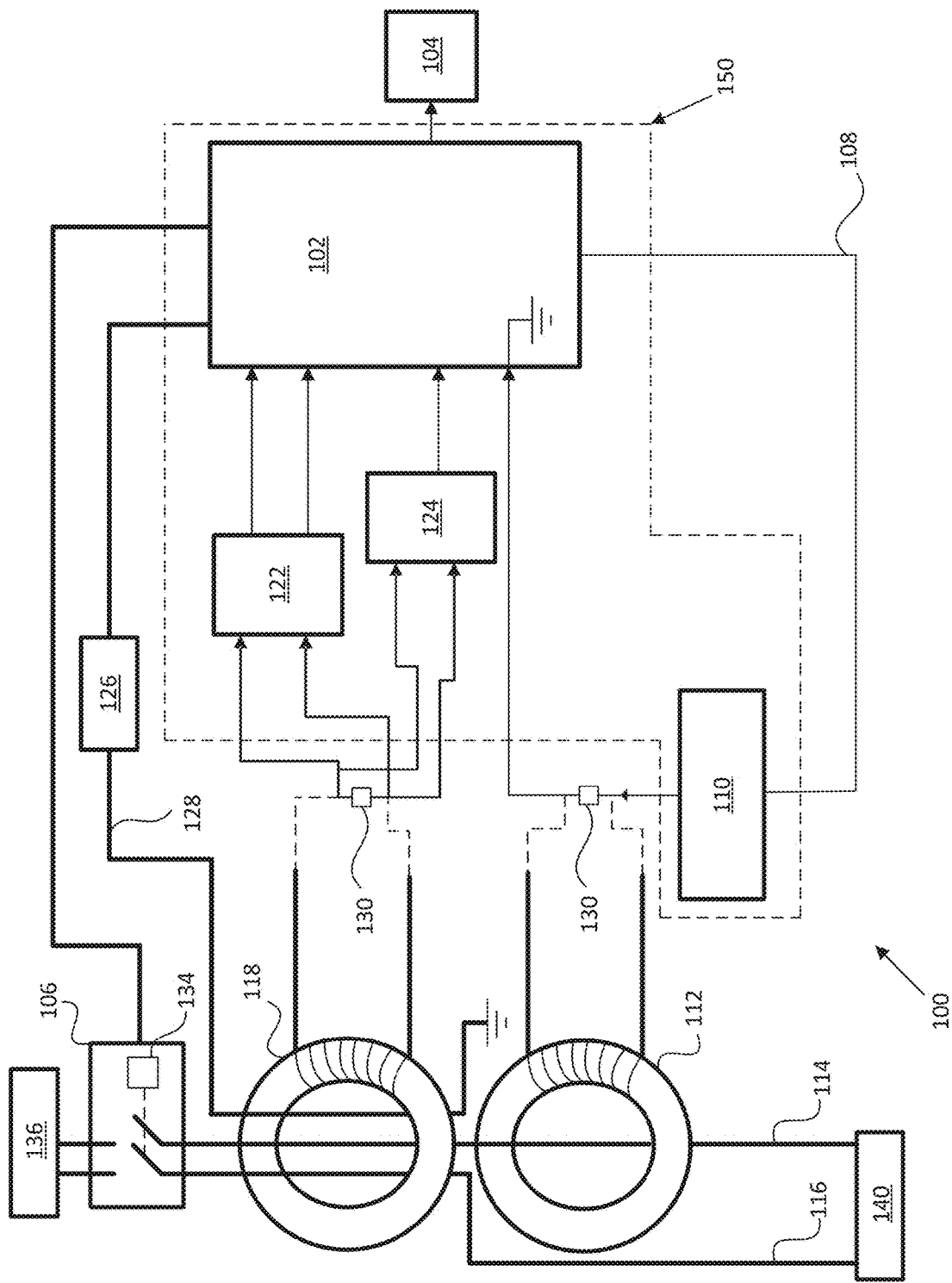
FIG. 1 illustrates a ground fault current interruption (GFCI) device according to an exemplary implementation of the present disclosure.

Noise generated by loads on AC lines impacts the performance of ground fault circuit interrupter (GFCI) breakers. Specifically, differential load noise can create a corresponding secondary signal across ground fault (GF) detection circuits. Varying frequencies within load noise signals makes the GFCI prone to unwanted nuisance trips and also impacts GF and grounded-neutral (GN) fault trip sensitivity. Furthermore, if the load noise frequency (or frequency band-width) interferes with one or more test signal frequencies, then the impact of the test signal is significantly reduced, making circuit gain insufficient to provide a high enough signal-to-noise ratio. Load noise may also affect GF detection because an improperly processed signal received at a processor's analog-to-digital converter (ADC) would be heavily affected by noise.

Some industry standards (e.g., UL943) require a grounded neutral fault to be detected and a trip circuit tripped at 2Ω (ohms), meaning any GN fault less than 2Ω should be detected and tripped regardless of environmental conditions. In some circumstances, a GN fault should be detected until at least 6Ω, but a trip circuit should not be tripped for an impedance greater than 6Ω. However, if load noise is present in AC lines, the difference in the signal observed by a processor via an ADC may not be granular enough to observe any difference between a 2Ω and 6Ω impedance. Specifically, differentiation between a 2Ω and 6Ω signal is not possible based on time domain AC root-mean-square (RMS), and GF faults would be detected either way. This limits GN detection resulting in conditions where a breaker does not issue a trip properly at an impedance of 2Ω in the presence of load noise when the threshold is set to trip only at 0Ω or 1Ω. Also, nuisance trips may occur at very high GN faults (e.g. 10 or more Ω) when a threshold is only set to trip up until 2Ω. Load noise is one of the most important parameters in the field that affects performance of residential breakers, and the frequency of load noise can be hard to estimate because it is highly dependent on the type of load.

Table I demonstrates the difficulty of using AC RMS analysis for detecting grounded-neutral faults in the presence of load noise. The data from Table I comes from a simulation of the operation of a GFCI circuit with and without load noise. As shown below, the AC RMS signal content—at a grounded-neutral signal detection channel of a GFCI (ADC-GN-DET)—is easily distinguishable between a 2Ω fault and a 6Ω condition without the presence of noise. However, when load noise is included in the simulation (here the noise is at 18 KHz-different from the 10 KHz test frequency), the same differentiation cannot be made.

TABLE I

Load Noise Simulation Result

Load Noise + GN Fault

| Load Noise frequency KHz | Test Signal Frequency KHz | GN Fault ohms | ADC-GN-Det (AC RMS) V | |
|---|---|---|---|---|
| — | 10 | 0.3 | 1.0575 | Without |
| — | 10 | 2 | 0.507 | Load Noise |
| — | 10 | 6 | 0.27 | |
| 18 | 10 | 0.3 | 1.0335 | With |
| 18 | 10 | 2 | 0.9675 | Load Noise |
| 18 | 10 | 6 | 0.979 | |

Advantageously, some implementations of the present disclosure provide for load noise cancelation/reduction to improve GN detection. In such implementations, the load noise may be analyzed (e.g., frequency components and accompanying amplitudes are measured) and cancelled out by injecting a signal (e.g., a current) of an equal frequency but opposite phase of at least part of the noise signal into differential ground fault measurement circuit (e.g., the primary side of the differential induction circuit). In this way, differential load noise (or a significant component thereof) across a ground fault circuit can be counter-acted by the injection of noise cancelation signal.

Cancelling the observation of the load noise current by the ground fault measurement circuit considerably reduces the impact of load noise on the performance of GN detection by GFCI breakers and minimizes the risk of nuisance trips based on load noise (particularly high frequency load noise). Providing improved GN detection and tripping makes for robust GFCI circuit breakers under various field conditions, particularly where a number and variety of loads operating on AC lines are significant, which in turn, means that the types and characteristics of load noise observable on the AC lines is substantial and creates issues for state of the art GFCI circuit breakers to operate effectively. Thus, enhancing GFCI circuit breakers with load noise cancellation is an effective mechanism for providing reliable GN fault detection. Furthermore, because industry standards-setting organizations are considering updates to standards and observing issues reported in GN detection product lines, reducing the impact of high frequency noise on the GN detection is a desirable feature.

GFCI devices according to the present disclosure may utilize a self-test circuit to implement the noise cancelation feature. A self-test circuit may have a self-test wire that runs through a primary side of a differential GF induction circuit (e.g. a current transformer for detecting current imbalance between line and natural conductors) to inject a signal into the primary side. The self-test circuit may configured to simulate a current imbalance to test GF fault detection (e.g., short-to-ground detection) and correct operation of the tripping circuit. This same self-test circuit may be used to inject the noise cancelation signal. An advantage of using the self-test circuit for load noise cancellation is that improved GFCI device performance can be achieved without substantially increasing the number of parts, circuit configuration, or cost of construction.

In some cases, therefore, a noise canceling GFCI device can be implemented (e.g., field implemented) by using pre-existing self-test circuits with self-test wires, thereby minimizing the requirement to add or implement additional circuitry or hardware components. The GFCI device may also include a specifically designed filter to pass load noise frequencies and test signal frequencies for GN detection. Determining frequencies and triggering injection of a current in opposite phase can be implemented by modifying the firmware/configuration of the GFCI's processor.

In implementations using a self-test wire, the current through self-test wires can be driven by a transistor such as, for example, a bipolar junction transistor (BJT) that is triggered by a processor. A dedicated analog-to-digital converter (ADC) channel for a GN detection (GN-ADC) circuit output may then be monitored. The GN-ADC may receive, as its analog signal, a signal from a differential induction circuit, for detecting current imbalances. The processor determines a frequency and phase of the GN-ADC signal (or a plurality thereof) and triggers the transistor with a signal that is the opposite phase and same frequency as the GN-ADC signal. This causes the transistor to switch states at the load noise frequency and inject a corresponding current into the self-test wire. Because the injected current is in the opposite phase as that of a load noise signal, the effective current observed by a ground fault differential circuit would ideally approach and reach zero, hence cancelling out the entire load noise.

According to implementations of the present disclosure, a GN fault test signal injected at a particular frequency can be coupled in to the GN test signal path using a GN induction circuit—e.g., a current transformer having the neutral conductor at its primary side and a processor driven resonance circuit at its secondary side. A GF circuit—e.g., a current transformer configured to a differential current between line and neutral conductors—can have its output signal conditioned by a GN detection circuit—e.g., a band pass filter. The load noise cancellation makes the GN detection easy such that the GN test signal frequency is passed through the circuit. A signal conditioning circuit can be designed such that the frequencies vary. In some implementations, frequencies between 3.5 kHz to 34.5 kHz are transmitted. The GN fault test signal may, therefore, be modified to operate at or near the frequency of the load noise cancellation signal.

Implementations of the present disclosure can therefore dynamically determine frequency of load noise to inject the current in opposite phase and counter the differential load noise to nullify or minimize its effect. Thus, GFCI circuit breakers according to the present disclosure function regardless of the type of load on the AC lines.

A GFCI device according to some implementations can mitigate the effects of load noise on GN detection by determining a quiet window (e.g., frequency or frequency range) in the load noise and injecting a GN test signal with a frequency in that quiet region. This noise avoidance feature can be used alone or in combination with the noise cancelation feature described above.

For example, a band pass filter design may allow a band of test signal frequencies to detect a GN fault. This allows various frequency components of a load noise signal to pass through the filter. A fast Fourier transform (FFT) can be performed on the detected signal by the band pass filter. The frequency corresponding to the minimum amplitude of the FFT can be determined in order to determine the quiet region. The test signal is then injected into a neutral AC line in the quiet region. AC RMS can then be performed on the injected signal. This method improves the accuracy of GN fault detection in the presence of load noise. In some implementations, the AC RMS of a GN fault detection circuit output is the measurement forming the basis of a GN fault detection. A GN detection data acquisition is a band pass filter that allows signal frequencies to be changed based on the load noise frequency and to be away from that frequency within a detected quiet region. A GN fault may be detected by injecting a grounded neutral test signal and analyzing the leakage current response to the test signal. The frequency of the test signal is selected based on analysis of the spectrum of leakage current without injecting the test signal, i.e., load noise, to avoid interference from the load noise. The current response to the injected grounded neutral test signal is used to measure impedance of a current loop formed by a potential grounded neutral fault, providing a direct and accurate detection of a grounded neutral fault. Method aspects will be in part apparent and in part explicitly discussed in the following description.

FIG. 1 illustrates a GFCI device 100 according to an exemplary implementation of the present disclosure. The GFCI device 100 includes a fault detector 150, and two induction circuits: a grounded neutral current transformer (GNCT) 112 and a ground fault current transformer (GFCT) 118. The fault detector 150 may include a processor 102 (e.g., a microcontroller), a resonating circuit 110, a self-test circuit 126, a ground fault data acquisition channel 122, and a grounded-neutral fault data acquisition channel 124. The ground fault data acquisition channel 122 and grounded neutral fault data acquisition channel 124 may be provided separately or as part of the processor 102, depending on the implementation. The GFCI device may also include a trip circuit 106.

The GFCI may also include peripherals 104, such as a data input or output device, a display, a wired or wireless communication device, a data storage device, or the like. In some implementations, processor 102 is configured to operate in tandem with one or more other processors by communicating via one or more peripherals 104, thereby enabling fault detection device 100 to communicate with other devices by wired or wireless communication. By way of example, this may enable fault detection device 100 to display data to a display other than a built-in display when fault detection device 100 is be positioned in such a manner that the display cannot be easily read by a user. Other advantages of enabling external communication include the ability to utilize increased processing power, to send data to other fault detection devices, and to remotely store data for generating inspection summaries and reports.

GFCT 118 is configured, inter alia, to measure a differential signal corresponding to the current imbalance between a line conductor 116 and neutral conductor 114, thereby a type of ground fault (e.g., a short-to-ground fault) may be detected. GNCT 112 is configured to induce a GN test signal—for use in detecting a grounded-neutral fault—in neutral conductor 114. GFCT 118 and GNCT 112 may be any component, system, or device configured to inject and/or measure the signals described above.

Each of GFCT 118 and GNCT 112 may be coupled to fault detector 150 via an impedance 130. In some implementations, impedance 130 is a capacitor.

In some implementations, GFCT 118 and GNCT are permanent or semi-permanent fixtures configured for continuous monitoring of line conductor 116 and neutral conductor 114, thereby ensuring uninterrupted grounded neutral fault detection without the requirement for a proactive inspection by personnel. In some implementations, GFCT 118 and GNCT 112 comprise current clamps with a split ring core for easy positioning around conductors.

In some implementations, GFCT 118 is positioned about line conductor 116 and neutral conductor 114 to obtain a first measurement of the current imbalance between line conductor 116 and neutral conductor 114. One or more inductive circuits in the GFCT 118 transform the AC current passing through line conductor 116 and neutral conductor 114 into an induced signal that is passed to fault detector 150 via the impedance 130. Fault detector 150 includes ground fault data acquisition channel 122 and grounded neutral fault data acquisition channel 124, processor 102, and resonating circuit 110. Ground fault data acquisition channel 122 and grounded neutral fault data acquisition channel 124 transmit respective data signals received from GFCT 118 to processor 102, which is configured to receive data signals from each channel. Ground fault data acquisition channel 122 may be an ADC and/or a signal filter such as, for example, a low pass filter.

Processor 102 may be one or more instances of a Central Processing Unit (CPU), a processing unit, a processing circuit, a processor, an Application Specific Integrated Circuit (ASIC), a Field Programmable Gate Array (FPGA), a microcontroller, a microprocessor, or other processing circuitry that may interpret and/or execute instructions or may be adapted to implement a preconfigured logic. The expression "processor" may thus represent a processing circuitry comprising a plurality of processing circuits, such as, e.g., any, some or all of the processing circuits mentioned above. The processor 102 may further perform data processing functions for inputting, outputting, and processing of data comprising data buffering and device control functions, such as call processing control, user interface control, or the like. According to the present disclosure a processor 102 that is "configured to" perform one or more operations includes processing circuitry (e.g., a microcontroller) that may interpret/and or execute instructions (i.e., instructions stored in a non-transitory computer readable medium) causing the processor 102 to perform the one or more operations, or logic circuitry (e.g., an FPGA or ASIC) preconfigured to perform the one or more operations. In some implementations, processor 102 is a microcontroller comprising a processor and memory sufficient to operate the grounded neutral fault detection device 100 independently, allowing for a self-contained device which may be more portable.

Processor 102 is also connected to trip circuit 106 and configured to send a trip signal to trip circuit 106 under predetermined conditions. For example, upon detection of one or more ground faults—e.g., a short-to-ground fault or a grounded-neutral fault—based upon a signal received from GFCT 118, processor 102 may send a trip signal to prevent unsafe power delivery from source 136 via line conductor 116 and neutral conductor 114. The trip circuit 106 is positioned between source 136 and load 140. In some implementations, trip circuit 106 comprises one or more relays 134 for switching line conductor 116 and/or neutral conductor 114 to/from a connected and disconnected state.

In some implementations, processor 102 is configured to monitor data in real time and send a trip signal immediately upon recognition of a grounded neutral fault. In some implementations, processor 102 is configured to detect a grounded neutral fault over predetermined periods of time, enabling fault detection averaging or repeated results before sending a trip signal. In some implementations, predetermined conditions for sending a trip signal are stored locally in a memory of the fault detection device 100. The predetermined conditions may be changed or updated via communication through peripherals 104.

Processor 102 may be configured to transmit a test signal 108 to one or more resonating circuits 110 in order to detect the presence of a grounded neutral fault. In some implementations, test signal 108 is also sent to GNCT 112 and injected into neutral conductor 114. The test signal 108 may include a waveform of known amplitude and frequency so that when sent to the one or more resonating circuits 110, the controller can measure an output from the one or more resonating circuits 110 and a signal generated by the GNCT 112 across a known capacitance. By measuring the frequency response of the result, processor 102 can determine an impedance of the neutral line 114 and determine whether the impedance is within predetermined acceptable thresholds. Test signal 108 may be of any frequency that the band-pass filter is configured to be able to pass. In some implementations, test signal 108 has a frequency ranging between 3 kHz and 30 kHz.

In some implementations, acceptable thresholds are defined by private organizations or by public agencies. By way of example, in some implementations the threshold for determining a grounded neutral fault may be determined by commonly practiced safety standards requiring a trip circuit to engage if an impedance of 2Ω (ohms) or less is measured in the neutral conductor. In some implementations a range of impedance values may be recognized by the processor 102 as non-ideal, but may not require automatically sending a trip signal to trip circuit 106. For example, processor 102 may send a trip signal for an impedance determination of 2Ω or less, but may designate any impedance between 2 and 6Ω as being non-ideal and either simply alert a user to the non-ideal condition or send a trip signal based on other predetermined conditions being met. In some implementations, processor 102 is configured to ignore impedance values greater than 6Ω, thereby avoiding so-called "nuisance trips" where the impedance value greatly exceeds the 2Ω threshold and a grounded neutral fault should not be detected.

GFCI device 100 also includes a self-test circuit 126 in communication with processor 102. Self-test circuit 126 is also connected to test wire 128, which passes through GFCT 118 between self-test circuit 126 and neutral. Thus, self-test circuit 126 is able to produce and transmit signals that can be injected into the current imbalance measured by GFCT 118. The self-test circuit 126 may include a transistor (such as a bipolar junction transistor (BJT)) that is operated by the processor to induce a current in the test wire 128.

According to an implementation of the present disclosure, the fault detector 150 may include a low pass filter to filter out high frequency noise in a load noise signal. The low pass filter may be a digital low pass filter, and may be part of an analog to digital converter circuit (e.g., the ground fault data acquisition channel 122) that converts the analog leakage signal from GFCT 118 to a filtered digital signal, which is sent to the processor 102. Alternatively, the low pass filter may be an analog low pass filter and another device (e.g., the processor 102) may perform the analog to digital conversion According to an implementation of the present disclosure, the fault detector 150 may include a band-pass filter that passes only certain bands of frequencies to processor 102. The band pass filter may be a digital band pass filter, and may be part of an analog to digital converter circuit (e.g., the grounded neutral fault data acquisition channel 125) that converts the analog leakage signal of the GFCT 118 to a second filtered digital signal, which is sent to the processor 102. Alternatively, the band pass filter may be an analog band pass filter and another device (e.g., the processor 102) may perform the analog to digital conversion.

Processor 102 may change the frequencies tested by a fault detecting device based on observable load noise frequencies, thereby avoiding frequencies at which a high amplitude of noise is measured and instead operating in a "quiet window" of frequencies. Thus, processor 102 in combination with the band-pass filter of the self-test circuit 126 are configured to operate in communication with one another to dynamically observe a quiet window in the signal received from GFCT 118.

In some implementations, the band-pass filter is configured to be able to passes frequencies between 3 kHz and 30 kHz. The band-pass filter sends an output signal to a grounded neutral fault detection channel, after which the signal is connected to a capacitor before being connected to ground. A grounded neutral fault detection channel may be included and may represent the channel carrying a signal which the processor 102 reads to make the ultimate determination of whether or not a grounded neutral fault is present.

Figure 2:
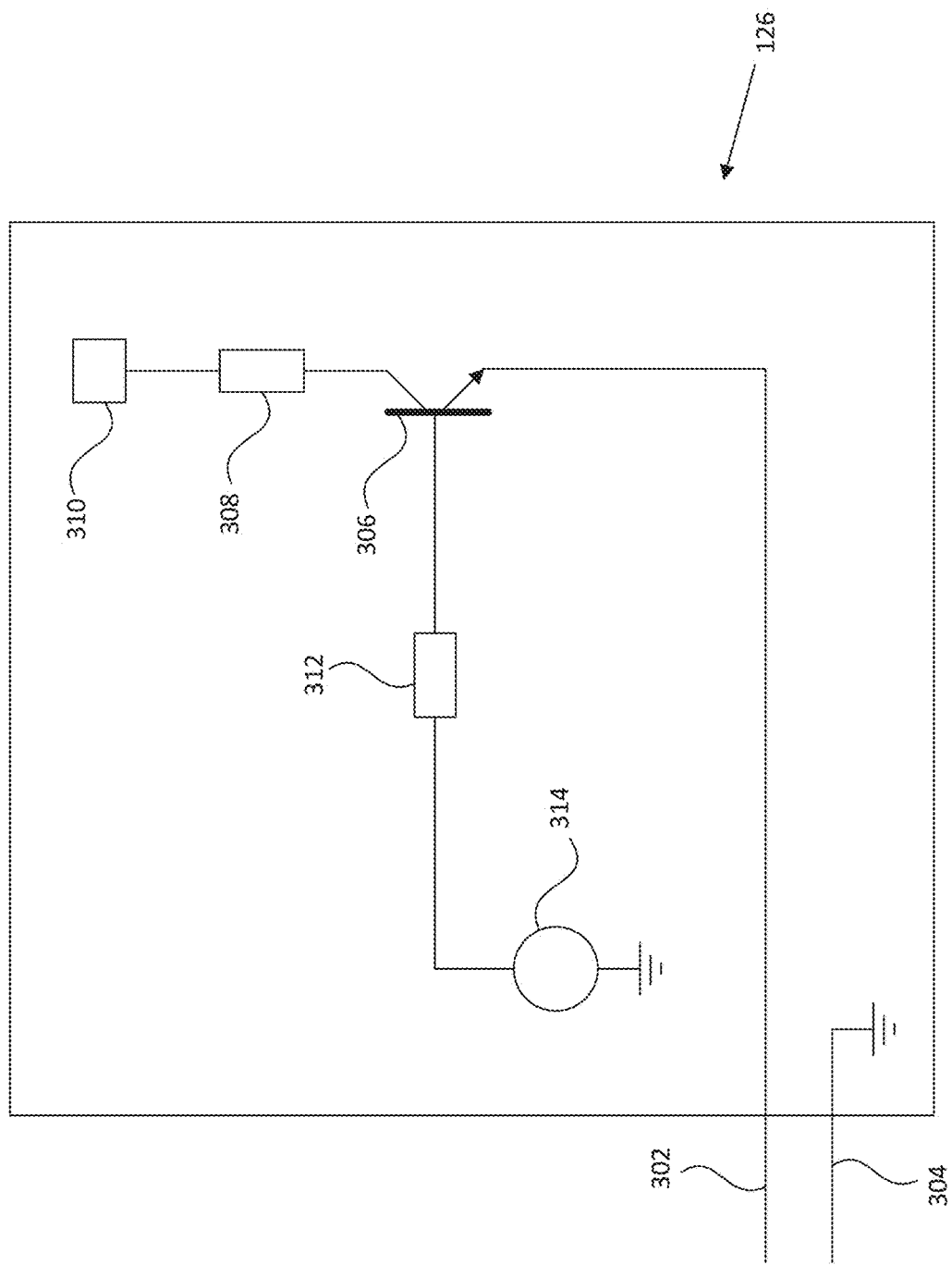
FIG. 2 is a circuit schematic of a self-test circuit according to an exemplary implementation of the present disclosure.

FIG. 2 shows a circuit schematic of self-test circuit 126. The self-test circuit is connected to signal lead 302 and ground lead 304. The ground lead 304 is connected to self-test circuit 126 to ensure a common ground is shared. The signal lead 302 is connected to the emitter of a transistor (e.g., an NPN transistor) 306. The collector of transistor 306 is connected to a rectified output 310 via a collector resistor 308. The base of transistor 306 is connected to a pulse voltage source 314 via a base resistor 312. In some implementations, the base resistor is less than at least one fifth the resistance of the collector resistor 308. In some implementations a resistance of about 5.6 k Ω is used for collector resistor 308 and a resistance of about 1 k Ω is used for the base resistor 312.

Figure 3:
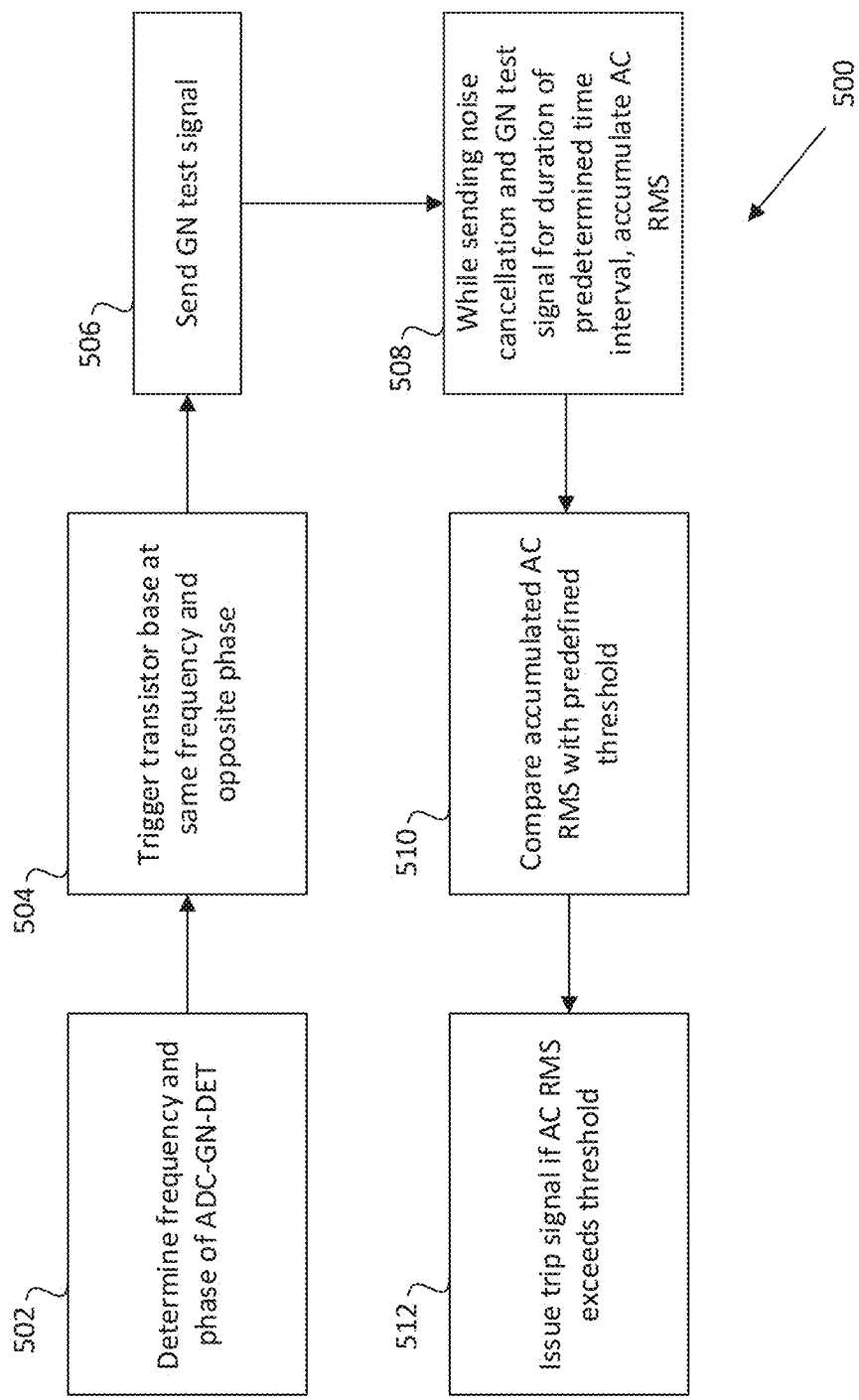
FIG. 3 illustrates a method of detecting a ground fault according to an exemplary implementation of the present disclosure using noise cancellation.

FIG. 3 shows a noise cancellation block diagram 500 as utilized in some implementations of the present disclosure. First, the fault detector (or its processor) makes a signal determination 502 in which it determines the frequency and phase of a signal at a grounded neutral fault detection channel. In some implementations, the signal determination 502 is made on a raw signal without a test signal injected. In some implementations, the signal determination 502 is made on a signal which has a test signal injected as in injection step 408 of FIG. 4 (discussed below).

Next, the fault detector triggers a transistor 504 by generating and sending an opposing signal to the base of the transistor. The opposing signal is of the same frequency as the signal determined in signal determination step 502, but has an opposite phase. Thus, the opposing signal is configured to be the waveform opposite of the signal observed at a grounded neutral fault detection channel and can cancel out the observed signal. The opposing signal (or a signal derived therefrom) may be injected as a noise cancellation signal into a primary side of a ground fault current transformer (e.g., at a primary side of GFCT 118 by operating the self-test circuit 126 to inject the opposing signal in test wire 128). While the opposing signal is being generated, the fault detector injects the grounded neutral fault test signal 506 into the neutral conductor (e.g., by sending the test signal to the secondary side of the GNCT 112 using the resonating circuit 110).

In a second determination step 508, the fault detector, while concurrently sending the noise cancelation signal and the grounded neutral test signal for a predetermined interval of time, accumulates AC RMS values of the signal received at the grounded neutral data acquisition channel (e.g., a band-passed filtered and digitized signal from the GFCT 118). Next, in comparison step 510, the accumulated AC RMS is compared with a predetermined threshold, such as a threshold value stored in memory. Finally, a trip signal is issued if the AC RMS exceeds the predetermined value in trip decision step 512.

Figure 4:
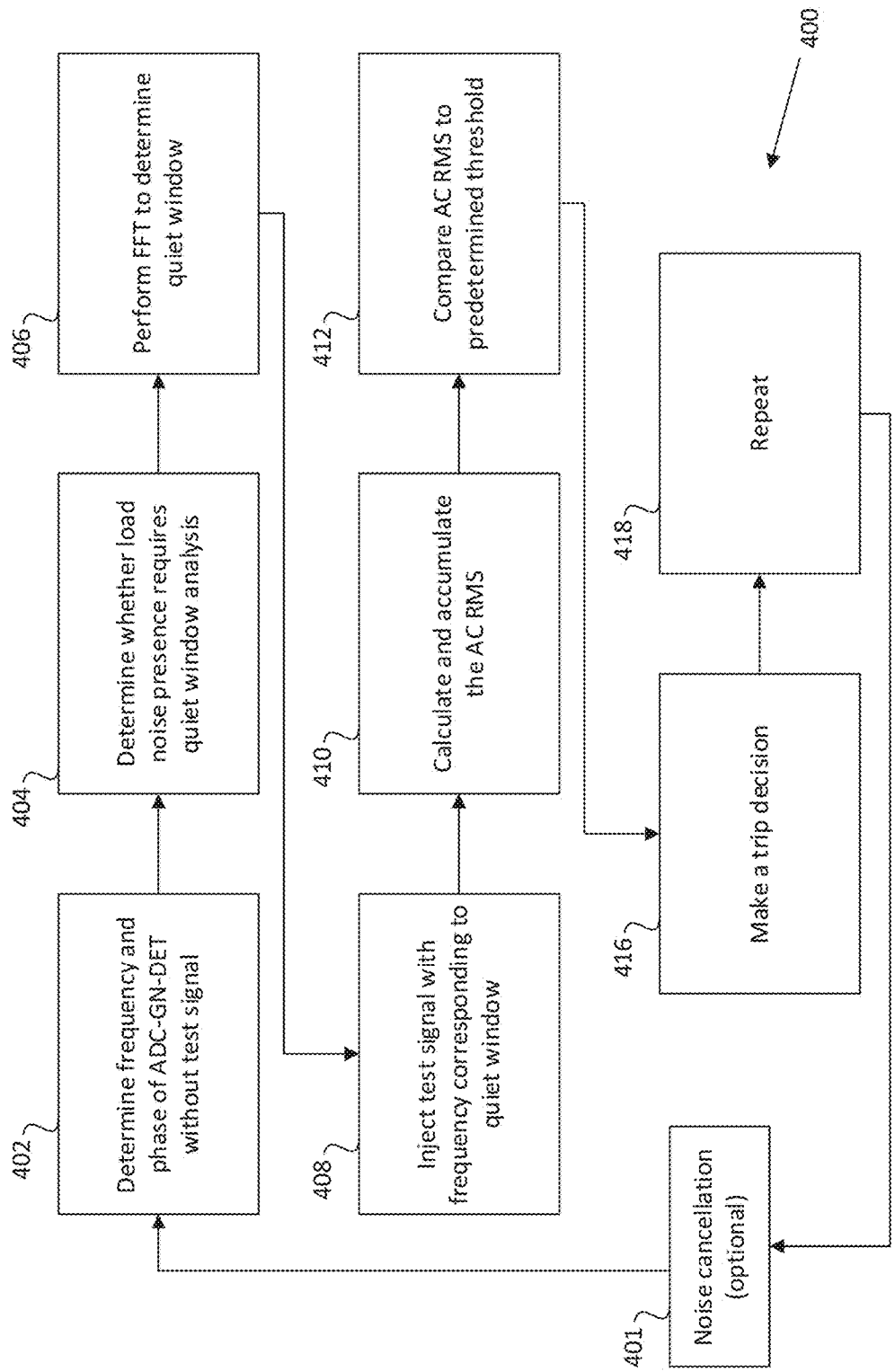
FIG. 4 illustrates a method of detecting a ground fault according to an exemplary implementation of the present disclosure using a quiet window.

FIG. 4 shows a noise avoidance block diagram 400 as utilized in some implementations of a method according to the present disclosure. First, a fault detector (e.g., a processor 102 of the fault detector 150) makes a signal determination 402 in which it determines the frequency and phase of a signal at a grounded neutral fault detection channel. The signal determination 402 is made on a raw signal without a test signal injected. Next, the fault detector (optionally) makes a threshold quiet window determination 404 by determining whether the load noise present on a signal received from a ground fault detection channel (e.g., via a first inductor or GFCT 118 and/or using a grounded neutral data acquisition channel 124) is sufficient to require quiet window analysis. The fault detector then evaluates 406 the frequency components of the load noise signal—for example by performing a fast Fourier transform (FFT)—to determine a quiet window.

To increase the speed and/or reduce the amount of data processed by the fault detector, a duration of the signal acquired for purposes of a FFT may be relatively short. For example, in some implementations, the duration of the signal acquired without a test signal being injected is 0.5 ms at a sampling rate of 64 kHz. As a result, 32 samples of the load noise are measured. A 32 bin FFT is performed and magnitudes at multiples of 2 kHz are derived. In some implementations, a single bin FFT is performed. In some implementations, magnitudes of all digital frequencies are measured. In some implementations, magnitudes at a plurality of predetermined frequencies are measured. The number of predetermined frequencies may be 3, 4, or 6. In one example, six predetermined frequencies at 10 kHz, 12 kHz, 14 kHz, 16 kHz, 18 kHz, and 20 kHz are used, where simulation shows that these frequencies provide robust test signals for detecting a grounded neutral fault in the presence of load noise.

Performing the FFT allows fault detector to store in memory separate spectral components of the load noise signal. Once spectral components are separately stored, the fault detector may determine which component has the lowest amplitude and then store the frequency information associated with the component of the lowest amplitude. In some implementations, the fault detector may not simply choose the component having the lowest amplitude, but may also chooses a component having neighboring spectral components with low amplitudes. In this manner, a quiet window with a margin of error representing a buffer can be selected. In some implementations, the frequency having the lowest magnitude among only predetermined frequencies is chosen.

Next, the fault detector injects a grounded neutral test signal 408 (e.g., by sending the test signal to the secondary side of the GNCT 112 using the resonating circuit 110). The fault detector generates a test signal having the same frequency as the frequency of the selected component after performing the frequency analysis (e.g., the FFT) 406. Thus, the fault detector is said to inject a test signal within the quiet window. Then, in calculation step 410, the fault detector (e.g., processor 102) calculates the root mean square (RMS) voltage of the AC signal (e.g., the AC signal received via GFCT 118 and processed by grounded neutral data acquisition channel 124) and accumulates the same. In comparison step 412, the fault detector compares the root-mean-square (RMS) calculated in calculation step 410 to a predetermined threshold, such as a threshold value stored in memory. A trip decision 416 can then be made by the fault detector based on the comparison step 412.

In some implementations, for example, the fault detector determines that the predetermined threshold value is met when an AC RMS value corresponding to 2Ω or less is calculated. In such an instance, an AC RMS value corresponding to 2Ω or less would lead to the fault detector sending a trip signal to ensure electrical power is delivered only within safe operational limits.

If the fault detector determines that a trip signal is not necessary, the sequence described in noise avoidance block diagram 400 may be repeated 418. Thus, continuous monitoring for a ground neutral fault may be achieved by a continuous cycle of determining new quiet windows and repeated trip decisions.

In some implementations the noise cancelation method of FIG. 3 and the noise avoidance method of FIG. 4 may be combined. This is represented by the optional noise cancelation operation 401 in FIG. 4. In one implementation, the noise cancelation method of FIG. 3 is run concurrently with the noise avoidance method of FIG. 4. In this implementation, first the frequency and phase of a noise signal at a grounded neutral fault detection channel are determined in the signal determination 502 operation from FIG. 3. Then, the opposing signal of the determined noise signal is injected into the primary side of the ground fault CT as the noise cancelation signal in the opposing signal triggering operation 504 from FIG. 3. Then, the noise avoidance method 400 of FIG. 4 may begin. That is, the frequency and phase of the grounded neutral detection signal may be determined in operation 402 of FIG. 4, a quiet window analysis is elected and the quiet window determined in operations 404 and 406 of FIG. 4, then the grounded neutral test signal is injected with a frequency corresponding to the quiet window in operation 408 of FIG. 4 (this also acts as the signal injection operation 506 of FIG. 3). The noise cancelation signal continues to be generated at least through the completion of accumulating the AC RMS signal during the injection of the grounded neutral test signal, which is performed in operation 410 of FIG. 3 (which also acts as the AC accumulation and calculation operation 508 from FIG. 3). The calculated AC RMS signal is then to a predetermined threshold and a trip decisions is made in operations 412 and 416 of FIG. 4 (which also act as operations 510 and 512 from FIG. 3). The method may then repeat 418.

In some implementations, only noise avoidance block diagram 400 is implemented in fault detection device 150. In some implementations, only noise cancellation block diagram 500 is implemented in fault detection device 150. In some implementations, both noise avoidance block diagram 400 and noise cancellation block diagram 500 are implemented into the operational configuration of the processor 102 of the fault detection device 150 to ensure optimal performance in detecting grounded neutral faults. For example, in implementations where both are implemented, the fault detection device 150 may implement noise cancellation block diagram 500 on a signal at a grounded-neutral fault detection channel that has already been injected with a test signal under noise avoidance block diagram 400. Thus, in implementations combining both noise avoidance and noise cancellation, a fault detection device 100 can perform optimally despite some load noise conditions.

As is readily appreciated, any method according to aspects of the present disclosure may be implemented in a computer program, having code, which when run by processor causes the processor to execute the steps of the method. The computer program may be included in a non-transitory computer readable medium. The computer readable medium may include essentially any non-transitory memory, such as a read-only memory (ROM), a programmable ROM (PROM), an erasable PROM (EPROM), a flash memory, an electrically EPROM (EEPROM), or a hard disk drive.

The benefits of some implementations of the present disclosure has been confirmed based on test data obtained based on a simulated GFCI circuit with simulated loads across AC lines. For example, simulated test results for quiet window noise avoidance as disclosed in some implementations described above are shown below in Table II.

The first four entries in Table II are simulations without load noise. As expected, the AC RMS signal content—at a grounded-neutral signal detection channel of a GFCI ADC-GN-DET—is easily distinguishable between a 2Ω fault and a 6Ω condition. With simulated load noise (here at 17.77 KHz—the same as the GN fault test frequency), it would have been expected (at least from conventional systems) that such a differentiation could not be made easily by the GFCI. The implementation of the quiet window allows for a different result.

Simulated test data has demonstrated quantifiable benefits for implementations of the noise cancellation mechanism of the present disclosure. In the noise cancellation simulation data provided in Table II, the self-test circuit is driven by a 60 Hz rectified voltage, and load noise cancellation occurs at the peaks of ADC-GN-DET signals in the form of full rectified line voltage.

The first three entries in Table II are of simulations of a GFCI circuit without load noise, and without using noise cancelation. As expected, the AC RMS signal content is easily distinguishable between a 2Ω fault and a 6Ω condition. The second three entries in Table II are of simulations of a GFCI circuit with load noise, but without noise cancelation. These simulations illustrate the expected operation of a state of the art GFCI circuit in the presence of significant load noise, i.e., the inability to distinguish between a 2Ω fault and a 6Ω condition. The last three entries in Table II, however, are of simulations of the GFCI circuit with load noise and using load noise cancellation. As shown below in the simulated data of a GFCI circuit using load noise cancellation, the AC RMS signal content is easily distinguishable between a 2Ω fault and a 6Ω condition.

TABLE II

Noise Cancelation Simulation Results

Load Noise + GN Fault

| Load Noise frequency KHz | Test Signal Frequency KHz | GN Fault ohms | ADC-GN-Det (AC RMS) V | |
|---|---|---|---|---|
| — | 10 | 0.3 | 1.0575 | Without |
| — | 10 | 2 | 0.507 | Load Noise |
| — | 10 | 6 | 0.27 | |
| 18 | 10 | 0.3 | 1.0335 | With |
| 18 | 10 | 2 | 0.9675 | Load Noise |
| 18 | 10 | 6 | 0.979 | |
| 18 | 18 | 0.3 | 1.229 | With Load |
| 18 | 18 | 2 | 0.895 | Noise + Load |
| 18 | 18 | 6 | 0.787 | Noise Cancellation |

In some implementations, similar results can be obtained by using a DC voltage to cancel the load noise, which in turn would improve the distinction between 2Ω and 6Ω faults.

Figure 5:
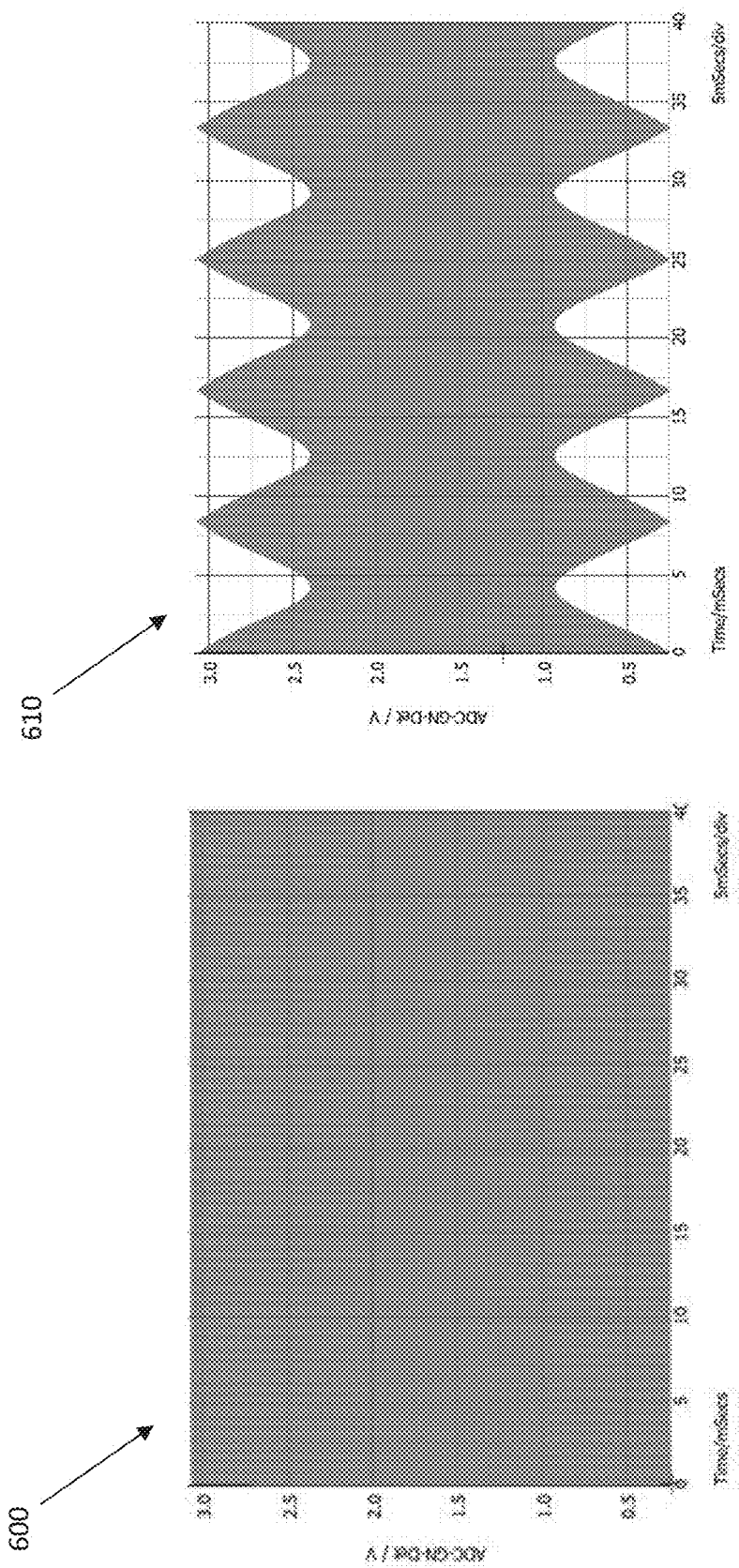
FIG. 5 depicts a simulated comparison between a ground fault measurement signal having load noise with and without using the noise cancelation according to an implementation of the present disclosure.

FIG. 5 shows a comparison of a noisy load noise signal 600 with a noise-cancelled load noise signal 610. The noisy signal 600 comprises so many noise signals of varying frequencies and amplitudes that there is no discernable means for determining when a grounded neutral fault exists. In state of the art devices, noise may have to be reduced by removing loads from the lines being examined. This has many downsides ranging from inconvenience to significant delays in operations due to the time and cost associated with restarting loaded equipment. However, utilizing the devices and methods described herein, a load noise signal may be processed into a noise-cancelled signal 610 so that grounded neutral fault determinations may be made within acceptable tolerances. For example, the noise-cancelled signal 610 shows improvements sufficient to discern signals within a 3-volt range.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different implementations described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A fault detector, the fault detector comprising a processor, the processor being configured to operate the fault detector to:
   receive a first signal from a first induction circuit, the first induction circuit configured to detect a current imbalance between a line conductor and a neutral conductor;
   determine a first frequency and a first phase of a noise signal component of the first signal;
   output a noise cancellation signal to a primary side of the first induction circuit, the noise cancellation signal having the first frequency of the noise signal component and an opposite phase than the first phase of the noise signal component;
   output a grounded neutral test signal while the noise cancellation signal is being output; and
   generate a trip signal based on determining that an impedance of the neutral conductor to ground is at or below a threshold level based upon the first signal received during the concurrent output of the noise cancelation signal and the grounded neutral test signal.

2. The fault detector of claim 1, wherein the processor is configured to operate the fault detector to determine that the impedance is at or below the threshold level by performing the following:
 outputting, for a predetermined time interval, the noise cancellation signal to the primary side of the first induction circuit;
 outputting, for the predetermined time interval, the grounded neutral test signal to a secondary winding of a second induction circuit such that a complementary signal is inductively injected into the neutral conductor;
 receiving, for the predetermined time interval, the first signal from the first induction circuit as a noise compensated signal;
 accumulating, for the predetermined time interval, an AC root mean square (RMS) voltage measurement of the noise compensated signal; and
 comparing the accumulated AC RMS voltage measurement of the noise compensated signal to a predetermined value corresponding to the threshold level.

3. The fault detector of claim 2, wherein the processor is configured to operate the fault detector to determine a test frequency of the grounded neutral test signal based upon the first frequency of the noise component of the first signal, the output grounded neutral test signal having the test frequency.

4. The fault detector of claim 2, wherein the processor is configured to operate the fault detector to determine the first frequency and the first phase of the noise signal component of the first signal based upon the first signal that is received while the grounded neutral test signal is not being output.

5. The fault detector of claim 2,
 wherein the first signal corresponds to band-pass filtered output signal of a secondary winding of the first induction circuit, and
 wherein the processor is configured to operate the fault detector to:
 determine a plurality of frequency components of the first signal;
 determine a quiet window of the first signal based upon the determined frequency components; and
 generate the grounded neutral test signal with a frequency corresponding to the quiet window.

6. The fault detector of claim 5, wherein the processor is configured to operate the fault detector to:
 determine a respective amplitude for each of the frequency components of the first signal;
 determine as a quiet component of the first signal one of the frequency components having the lowest determined amplitude, and
 set the quiet window based on the quiet component such that a range of frequencies within the quiet window comprises a corresponding frequency associated with the quiet component.

7. The fault detector of claim 1, wherein the threshold level is preconfigured to correspond to an impedance of 2 ohms.

8. The fault detector of claim 1,
 wherein the first signal corresponds to band-pass filtered output signal of a secondary winding of the first induction circuit, and
 wherein the processor is configured to operate the fault detector to:
 determine a plurality of frequency components of the first signal;
 determine respective amplitudes for the frequency components of the first signal;
 select, as the noise signal component of the first signal, a respective one of the frequency components of the first signal with the highest amplitude from among the determined amplitudes of the frequency components of the first signal.

9. The fault detector of claim 1, wherein the processor is configured to operate the fault detector to:
 receive a second signal from the first induction circuit;
 determine whether there is the current imbalance between the line conductor and the neutral conductor based upon the second signal; and
 generate the trip signal based on determining that there is the current imbalance.

10. A ground fault interrupter circuit (GFCI), the GFCI comprising:
 the fault detector of claim 1;
 the first induction circuit comprising a core, the primary side, and a secondary side, an aperture of the core being configured to receive the line conductor and the neutral conductor to form at least part of a primary winding at the primary side, and the secondary side comprising a secondary winding, wound around the core and coupled to the ground fault detector to transmit the first signal; and
 a trip circuit configured to disconnect at least the line conductor from a supply to a load based on receiving the trip signal from the fault detector,
 wherein the fault detector comprises a self-test circuit comprising a transistor, the transistor having an output coupled to a wire, the wire passing through the core of the first induction circuit forming another part of the primary winding at the primary side,
 wherein the processor of the fault detector is configured to drive the transistor of the self-test circuit to output the noise cancellation signal to the wire such that at least part the noise signal is canceled and not detected at the first induction circuit.

11. The GFCI of claim 10, the GFCI comprising:
 a second induction circuit comprising a core, a primary side, and a secondary side, an aperture of the core being configured to receive the neutral conductor to form a primary winding at the primary side, and the secondary side comprising a secondary winding, wound around the core,
 wherein the processor is configured to operate the fault detector to output, a grounded neutral test signal to the secondary winding of the second induction circuit such that a complementary signal is inductively injected into the neutral conductor.

12. A method of detecting a ground fault, the method comprising:
 receiving a first signal from a first induction circuit, the first induction circuit configured to detect a current imbalance between a line conductor and a neutral conductor;
 determining a first frequency and a first phase of a noise signal component of the first signal;
 outputting a noise cancellation signal to a primary side of the first induction circuit, the noise cancellation signal having the first frequency of the noise signal component and an opposite phase than the first phase of the noise signal component;
 outputting a grounded neutral test signal while the noise cancellation signal is being output; and
 generating a trip signal based on determining that an impedance of the neutral conductor to ground is at or below a threshold level based upon the first signal received during the concurrent output of the noise cancelation signal and the grounded neutral test signal.

13. The method of claim 12, wherein determining that the impedance is at or below the threshold level comprises:
outputting for a predetermined time interval, the noise cancellation signal to the primary side of the first induction circuit;
outputting, for the predetermined time interval, the grounded neutral test signal to a secondary winding of a second induction circuit such that a complementary signal is inductively injected into the neutral conductor;
receiving, for the predetermined time interval, the first signal from the first induction circuit as a noise compensated signal;
accumulating, for the predetermined time interval, an AC root mean square (RMS) voltage measurement of the noise compensated signal during the output of the grounded neutral test signal;
comparing the accumulated AC RMS voltage measurement of the noise compensated signal to a predetermined value corresponding to the threshold level.

14. The method of claim 13, the method comprising determining a test frequency of the grounded neutral test signal based upon the first frequency of the noise component of the first signal, the output test signal having the test frequency.

15. The method of claim 13, the method comprising determining the first frequency and the first phase of the noise signal component of the first signal based upon the first signal that is received while the grounded neutral test signal is not being output.

16. The method of claim 13,
wherein the first signal corresponds to band-pass filtered output signal of a secondary winding of the first induction circuit, and
wherein the method comprises:
determining a plurality of frequency components of the first signal;
determining a quiet window of the first signal based upon the determined frequency components; and
generating the grounded neutral test signal with a frequency corresponding to the quiet window.

17. The method of claim 16, the method comprising:
determining a respective amplitude for each of the frequency components of the first signal;
determining as a quiet component of the first signal one of the frequency components having the lowest determined amplitude; and
setting the quiet window based on the quiet component such that a range of frequencies within the quiet window comprises a corresponding frequency associated with the quiet component.

18. The method of claim 12,
wherein the first signal corresponds to band-pass filtered output signal of a secondary winding of the first induction circuit, and
wherein the method comprises:
determining a plurality of frequency components of the first signal;
determining respective amplitudes for the frequency components of the first signal;
selecting, as the noise signal component of the first signal, a respective one of the frequency components of the first signal with the highest amplitude from among the determined amplitudes of the frequency components of the first signal.

19. A fault detector, the fault detector comprising a processor, the processor being configured to operate the fault detector to:
receive a first signal from a first induction circuit, the first induction circuit configured to detect a current imbalance between a line conductor and a neutral conductor;
determine a first frequency and a first phase of a noise signal component of the first signal;
output a noise cancellation signal to a primary side of the first induction circuit, the noise cancellation signal having the first frequency of the noise signal component and an opposite phase than the first phase of the noise signal component; and
generate a trip signal based on a concurrent signal received by the processor.

20. The fault detector of claim 19, wherein the signal received at the processor is indicative of an impedance of the neutral conductor to ground, the impedance being at or below a threshold level.

* * * * *